United States Patent
Kim (10) Patent No.: US 8,330,173 B2
(45) Date of Patent: Dec. 11, 2012

(54) NANOSTRUCTURE HAVING A NITRIDE-BASED QUANTUM WELL AND LIGHT EMITTING DIODE EMPLOYING THE SAME

(75) Inventor: Hwa Mok Kim, Seoul (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 891 days.

(21) Appl. No.: 11/993,949

(22) PCT Filed: Jun. 25, 2005

(86) PCT No.: PCT/KR2005/001996
§ 371 (c)(1),
(2), (4) Date: Dec. 26, 2007

(87) PCT Pub. No.: WO2007/001098
PCT Pub. Date: Jan. 4, 2007

(65) Prior Publication Data
US 2008/0157057 A1  Jul. 3, 2008

(51) Int. Cl.
*H01L 33/08* (2010.01)
*H01L 33/20* (2010.01)
(52) U.S. Cl. ........... 257/93; 257/13; 257/88; 257/95; 257/96; 257/E33.005; 257/E33.028; 257/E33.034; 257/E33.068; 438/47; 977/762; 977/816
(58) Field of Classification Search ........... 257/79–103, 257/9–39, 183–201, E33.005, E33.028, E33.034, 257/E33.068; 438/22–47; 977/759, 762, 977/816, 825
See application file for complete search history.

(56) References Cited

U.S. PATENT DOCUMENTS
8,129,710 B2 *  3/2012  Cho et al. ................. 257/13
(Continued)

FOREIGN PATENT DOCUMENTS
JP  04-212489  8/1992
(Continued)

OTHER PUBLICATIONS

Quantum Electronics Conference, 2005. Jul. 11, 2005, pp. 141-142, Horng-Shyang Chen et al.: Three-Dimension Quantum Confinement in InGaN/GaN Nano-rods.
M. Yoshizawa, et al., "Self-organization of GaN . . . for fabricating GaN quantum disks." Journal of Growth 189/190 (1998), pp. 138-141.

*Primary Examiner* — Steven J Fulk
*Assistant Examiner* — Eric Ward
(74) *Attorney, Agent, or Firm* — H.C. Park & Associates, PLC (57) ABSTRACT

Disclosed are a nanostructure with an indium gallium nitride quantum well and a light emitting diode employing the same. The light emitting diode comprises a substrate, a transparent electrode and an array of nanostructures interposed between the substrate and the transparent electrode. Each of the nanostructures comprises a core nanorod, and a nano shell surrounding the core nanorod. The core nanorod is formed substantially perpendicularly to the substrate and includes a first nanorod of a first conductivity type, an $(Al_xIn_yGa_{1-x-y})N$ (where, $0 \leq x < 1$, $0 \leq y \leq 1$ and $0 \leq x+y \leq 1$) quantum well, and a second nanorod of a second conductivity type, which are joined in a longitudinal direction. The nano shell is formed of a material with a bandgap greater than that of the quantum well, and surrounds at least the quantum well of the core nanorod. Meanwhile, the second nanorods are connected in common to the transparent electrode. Accordingly, with the nano shells, it is possible to provide a light emitting diode capable of improving external quantum efficiency by preventing non-radiative recombination on a surface of the $(Al_xIn_yGa_{1-x-y})N$ quantum well.

17 Claims, 3 Drawing Sheets

U.S. PATENT DOCUMENTS

| | | | |
|---|---|---|---|
| 8,129,728 B2 * | 3/2012 | Pan et al. | 257/79 |
| 2002/0172820 A1 * | 11/2002 | Majumdar et al. | 428/357 |
| 2003/0141507 A1 * | 7/2003 | Krames et al. | 257/79 |
| 2004/0094772 A1 * | 5/2004 | Hon et al. | 257/102 |
| 2004/0252737 A1 * | 12/2004 | Yi et al. | 372/43 |
| 2005/0040414 A1 * | 2/2005 | Hirayama et al. | 257/97 |
| 2005/0179052 A1 * | 8/2005 | Yi et al. | 257/183 |
| 2005/0189558 A1 * | 9/2005 | Liu | 257/100 |
| 2005/0194598 A1 * | 9/2005 | Kim et al. | 257/79 |
| 2006/0208273 A1 * | 9/2006 | Kang | 257/103 |
| 2006/0223211 A1 * | 10/2006 | Mishra et al. | 438/41 |
| 2011/0177683 A1 * | 7/2011 | Kahen et al. | 438/509 |
| 2011/0204327 A1 * | 8/2011 | Hiruma et al. | 257/13 |

FOREIGN PATENT DOCUMENTS

| | | |
|---|---|---|
| JP | 6-244457 | 9/1994 |
| JP | 2001223439 | 8/2001 |
| JP | 2003124115 | 4/2003 |
| JP | 2003163371 | 6/2003 |
| JP | 2004-532133 | 10/2004 |
| WO | 02/080280 | 10/2002 |
| WO | 2004/004927 | 1/2004 |
| WO | 2004/088755 | 10/2004 |

* cited by examiner

NANOSTRUCTURE HAVING A NITRIDE-BASED QUANTUM WELL AND LIGHT EMITTING DIODE EMPLOYING THE SAME

TECHNICAL FIELD

The present invention relates to a nanostructure, a light emitting diode employing the same, and a method of fabricating the same, and more particularly, to a nanostructure having a nitride-based quantum well, a light emitting diode employing an array of the nanostructures, and a method of fabricating the same.

BACKGROUND ART

Initially, an LED has been widely used as a simple display element for an instrument panel. In recent years, the LED attracts attention as a full color display device with high luminance, high visibility and long life cycle, such as a large-sized electronic display board, and light sources for backlight and general illumination. This is achieved through recent development of blue and green LEDs with high luminance. Meanwhile, a III-nitrogen compound semiconductor such as GaN is recently studied as a material for LEDs. This is because a III-V group nitride semiconductor has wide bandgap and thus enables obtainment of light in a substantially full range of wavelength from visible light to an ultraviolet ray according to the composition of the nitride.

A typical GaN LED, i.e., a laminated-film type LED formed by sequentially stacking an n-type impurity-doped n-GaN layer, an InGaN active layer, and a p-type impurity-doped p-GaN layer on a sapphire substrate, has limited performance (luminance), because there are a great deal of threading dislocations caused by lattice mismatching due to physical properties or limitations on growth of GaN. A laminated-film GaN LED has advantages in that it is relatively easy to design and fabricate and has low temperature sensitivity, while it has disadvantages of a low efficiency of light emitting, a wide spectrum width, a high output deviation and the like, as well as the threading dislocations.

To overcome the disadvantages of the laminated-film type LED, a nano-scaled LED with a p-n junction formed of one-dimensional rods or line-shaped nanorods (nanowires), or a micro-scaled LED such as a micro-ring or a micro-disc has been studied. Since the nanorod-structured LED is a simple p-n junction diode, it is difficult to obtain high luminance. The micro-ring or micro-disc LEDs are currently fabricated by means of photolithography. In a photolithography and etching process, however, the lattice structure of GaN is damaged. This makes the luminance or light-emission efficiency of a product unsatisfactory.

Meanwhile, since a nanorod LED has a great ratio of surface to volume, non-radiative recombination on a surface greatly affects external quantum efficiency of the nanorod LED. Accordingly, it is necessary to reduce the influence of the non-radiative recombination on the surface.

DISCLOSURE OF INVENTION

Technical Problem

An object of the present invention is to provide a nanostructure with high luminance and high light-emission efficiency, which can reduce the influence of non-radiative recombination on a surface of the nanostructure.

Another object of the present invention is to provide a light emitting diode employing an array of nanostructures capable of reducing the influence of non-radiative recombination on surfaces of the nano structures.

A further object of the present invention is to provide a method of fabricating a light emitting diode employing an array of nanostructures capable of reducing the influence of non-radiative recombination on surfaces of the nanostructures.

Technical Solution

To achieve the objects of the present invention, the present invention provides a nanostructure, a light emitting diode employing the nanostructure, and a method of fabricating the light emitting diode. According to an aspect of the present invention, the nanostructure includes a core nanorod having a first nanorod of a first conductivity type, a $(Al_xIn_yGa_{1-x-y})N$ (where, $0 \leq x \leq 1$, $0 \leq y \leq 1$ and $0 \leq x+y \leq 1$) quantum well, and a second nanorod of a second conductivity type, which are joined in a longitudinal direction. A nano shell formed of a material with a bandgap greater than that of the quantum well surrounds at least the quantum well. According to the aspect of the present invention, it is possible to provide an LED having a nanostructure with high luminance and high light-emission efficiency by interposing the $(Al_xIn_yGa_{1-x-y})N$ quantum well between the p-n junction interface. It is also possible to further improve the light-emission efficiency by reducing non-radiative recombination on a surface of the quantum well by means of the nano shell.

Here, the first conductivity type and the second conductivity type refer to an n-type and a p-type, or a p-type and an n-type. Further, the nanorod refers to a structure having a relatively longer length over its diameter and having a diameter of less than 1 µm. In addition, the nanorod herein refers to a nano-scaled structure that is formed in a bottom-up manner, i.e., through growth rather than etching.

The first and second nanorods are formed of a semiconductor material that matches the quantum well in view of their lattices. For example, the nanorods may be GaN or ZnO based nanorods. The GaN based nanorod may be formed of GaN or a ternary or quaternary nitride containing Al and/or In added to GaN and may be represented by a general formula, $(Al_xIn_yGa_{1-x-y})N$ (where, $0 \leq x \leq 1$, $0 \leq y \leq 1$ and $0 \leq x+y \leq 1$). The ZnO based nanorod may be formed of ZnO or a ternary oxide containing Mg added to ZnO and may be represented by a general formula, $Zn_{1-x}Mg_xO$ (where, $0 \leq x \leq 1$).

The material with a bandgap greater than that of the $(Al_xIn_yGa_{1-x-y})N$ quantum well may also be either a GaN based nitride represented by a general formula, $(Al_xIn_yGa_{1-x-y})N$ (where, $0 \leq x \leq 1$, $0 \leq y \leq 1$ and $0 \leq x+y \leq 1$) or a ZnO based oxide. The amounts of Al and In in the GaN based nitride is selected to obtain the band gap greater than that of the $(Al_xIn_yGa_{1-x-y})N$ quantum well.

The $(Al_xIn_yGa_{1-x-y})N$ quantum well may be a multi quantum well formed by alternately stacking a plurality of $(Al_xIn_yGa_{1-x-y})N$ (where, $0 \leq x \leq 1$, $0 \leq y \leq 1$ and $0 \leq x+y \leq 1$) layers and a plurality of $(Al_xIn_3Ga_{1-x-y})N$ (where, $0 \leq x \leq 1$, $0 \leq y \leq 1$ and $0 \leq x+y \leq 1$) barriers.

In addition, at least two of the plurality of $(Al_xIn_yGa_{1-x-y})N$ (where, $0 \leq x \leq 1$, $0 \leq y \leq 1$ and $0 \leq x+y \leq 1$) layers may have different amounts of In and/or different thicknesses. As the amount of In Increases, the bandgap of $(Al_xIn_yGa_{1-x-y})N$ decreases. Accordingly, it is possible to implement light with at least two peak wavelengths, e.g., multi-color light, by adjusting the amounts of In in the $(Al_xIn_yGa_{1-x-y})N$ layers. Further, the bandgap of the $(Al_xIn_yGa_{1-x-y})N$ layer increases by reducing the thickness of the $(Al_xIn_yGa_{1-x-y})N$ layer to the Bohr excitation radius or less. Thus, it is possible to implement light with at least two peak wavelengths, e.g., multi-color light, by adjusting the thicknesses of the $(Al_xIn_yGa_{1-x-y})N$ layers.

According to another aspect of the present invention, a light emitting diode of the present invention comprises a substrate, a transparent electrode, and an array of nanostructures interposed between the substrate and the transparent electrode. Each of the nanostructures comprises a core nanorod, and a nano shell surrounding the core nanorod. The core nanorod is formed substantially perpendicularly to the substrate and includes a first nanorod of a first conductivity type, an $(Al_xIn_yGa_{1-x-y})N$ (where, $0 \leq x \leq 1$, $0 \leq y \leq 1$ and $0 \leq x+y \leq 1$) quantum well, and a second nanorod of a second conductivity type, which are joined in a longitudinal direction. The nano shell is formed of a material with a bandgap greater than that of the quantum well, and surrounds at least the quantum well of the core nanorod. Meanwhile, the second nanorods are connected in common to the transparent electrode. Accordingly, it is possible to provide a light emitting diode capable of increasing external quantum efficiency by preventing non-radiative recombination on a surface of the $(Al_xIn_yGa_{1-x-y})N$ quantum well by means of the nano shells.

The $(Al_xIn_yGa_{1-x-y})N$ quantum well may be a multi quantum well formed by alternately stacking a plurality of $(Al_xIn_yGa_{1-x-y})N$ (where, $0 \leq x \leq 1$, $0 \leq y \leq 1$ and $0 \leq x+y \leq 1$) layers and a plurality of $(Al_xIn_yGa_{1-x-y})N$ (where, $0 \leq x \leq 1$, $0 \leq y \leq 1$ and $0 \leq x+y \leq 1$) barriers. Further, at least two of the plurality of $(Al_xIn_yGa_{1-x-y})N$ layers may have different amounts of In and/or different thicknesses to emit light with at least two peak wavelengths.

Each of the first nanorod, the second nanorod and the nano shell may be formed of $(Al_xIn_yGa_{1-x-y})N$ (where, $0 \leq x \leq 1$, $0 \leq y \leq 1$ and $0 \leq x+y \leq 1$) or a ZnO based material.

Meanwhile, empty spaces between the nanostructures may be filled with a transparent insulating material, such as SOG, $SiO_2$, epoxy or silicone. At this time, tips of the second nanorods protrude beyond a top surface of the transparent insulating material and are connected to the transparent electrode. Further, the transparent insulating material may contain a fluorescent material for converting the wavelength of a portion of light emitted from the core nanorod. Accordingly, it is possible to implement multi-color light by mixing the light emitted from the nanostructures with the light of which the wavelength has been converted by the fluorescent material.

A buffer layer of a first conductivity type may be interposed between the substrate and the array of the nanostructures. Further, the buffer layer has a portion extending from the array of the nanostructures, and an electrode pad may be formed on the extension portion of the buffer layer. Since the buffer layer is electrically connected to the first nanorods of the nanostructures, electric power is supplied to the nanostructures through the transparent electrode and the buffer layer. The substrate may be an insulating substrate such as a sapphire or glass substrate.

In this case, it is necessary to supply power through the transparent electrode and the buffer layer. Otherwise, the substrate may be a conductive substrate such as Si, SiC or ZnO. In this case, the buffer layer may be omitted and the electrode pad may be formed on a surface of the conductive substrate opposite to the array.

According to a further aspect of the present invention, a method of fabricating a light emitting diode comprises the step of forming an array of core nanorods perpendicularly to a substrate. Each of the core nanorods has a first nanorod of a first conductivity type, an $(Al_xIn_yGa_{1-x-y})N$ (where, $0 \leq x \leq 1$, $0 \leq y \leq 1$ and $0 \leq x+y \leq 1$) quantum well and a second nanorod of a second conductivity type, which are joined in a longitudinal direction. Nano shells are formed of a material with a bandgap greater than that of the quantum well so as to surround at least the quantum wells. At this time, the nano shells are formed such that tips of the second nanorods are exposed. A transparent electrode is formed to be connected in common to the exposed tips of the second nanorods. Accordingly, it is possible to provide a light emitting diode employing the array of nanostructures capable of preventing non-radiative recombination on surfaces of the $(Al_xIn_yGa_{1-x-y})N$ quantum wells.

The formation of the nano shells may comprise forming first nano shells for covering the core nanorods, and etching tips of the first nano shells to expose the tips of the second nanorods.

The method may further comprise the step of forming a transparent insulating material with which empty spaces between the core nanorods are filled after the formation of the first nano shells. At this time, the transparent insulating material may be formed to be below the level of the second nanorods so that the tips of the second nanorods and nano shells protrude outwardly.

A buffer layer of a first conductivity type may be formed on the substrate before the array of core nanorods is formed. After the transparent electrode is formed, the transparent electrode and the transparent insulating material may be patterned to expose a portion of the buffer layer by means of photolithography and etching processes. Further, electrode pads may be formed on the transparent electrode and the exposed portion of the buffer layer, respectively.

BEST MODE FOR CARRYING OUT THE INVENTION

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

Figure 1:
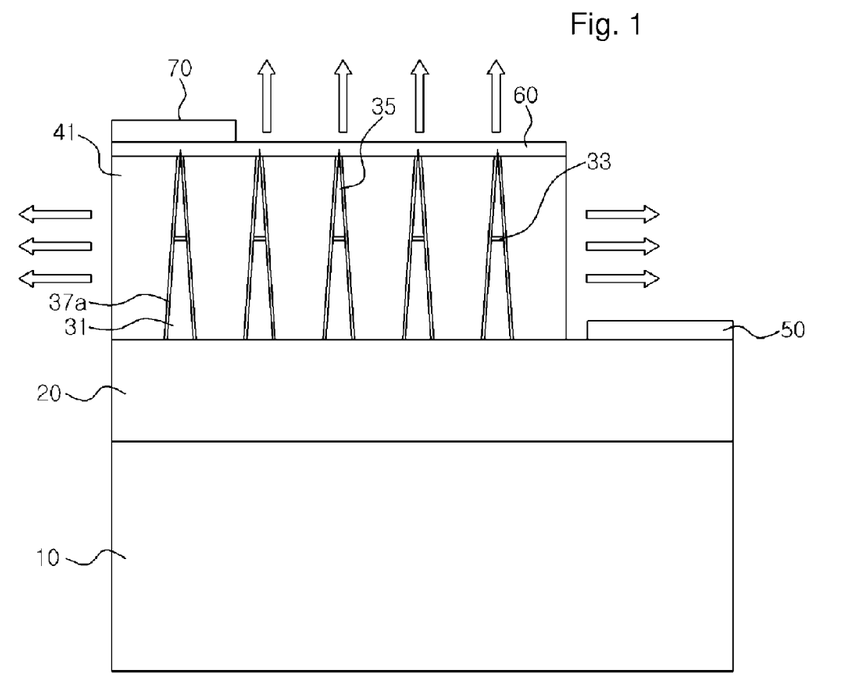
FIG. 1 is a sectional view of a light emitting diode according to an embodiment of the present invention.
Figure 2:
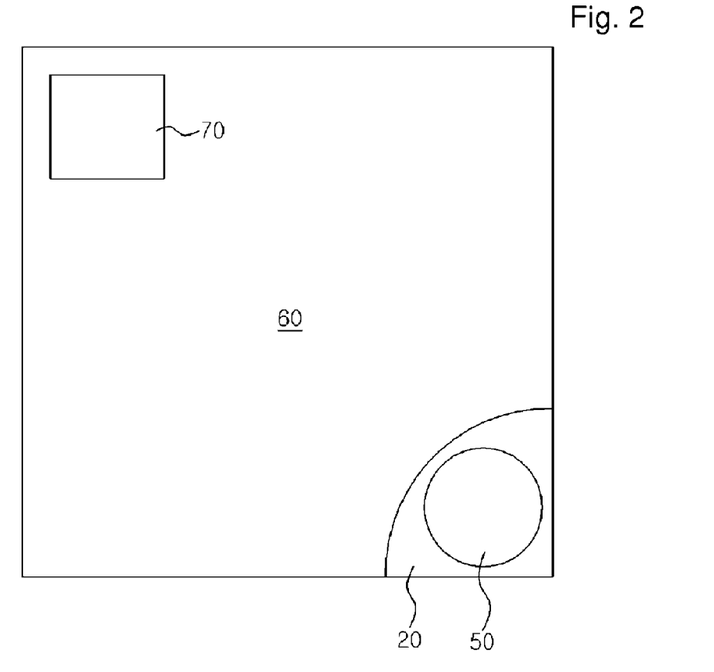
FIG. 2 is a plan view of the light emitting diode shown in FIG. 1.

FIG. 1 is a sectional view of a light emitting diode (hereinafter, referred to as "LED") according to an embodiment of the present invention, and FIG. 2 is a plan view of the light emitting diode shown in FIG. 1.

Referring to FIGS. 1 and 2, the light emitting diode comprises an array of nanostructures on a substrate 10. The substrate 10 may be an insulating substrate such as a sapphire or glass substrate, or a conductive substrate such as a Si, SiC or ZnO substrate.

Each of the nanostructures comprises a core nanorod having a n-type first nanorod 31, a $(Al_xIn_yGa_{1-x-y})N$ (where, $0 \leq x \leq 1$, $0 \leq y \leq 1$ and $0 \leq x+y \leq 1$) quantum well 33, and a p-type second nanorod 35, which are joined in a longitudinal direction; and a nano shell 37a for surrounding at least the quantum well of the core nanorod. The core nanorods are formed substantially perpendicularly to the substrate 10. The nano shells 37a are formed of a material with a bandgap greater than that of the quantum well.

The first and second nanorods may be formed of $Al_xIn_yGa_{(1-x-y)}N$ (where, $0 \leq x \leq 1$, $0 \leq y \leq 1$ and $0 \leq x+y \leq 1$) or ZnO. Similarly, the nano shell 37a may also be formed of $Al_xIn_yGa_{(1-x-y)}N$ (where, $0 \leq x \leq 1$, $0 \leq y \leq 1$ and $0 \leq x+y \leq 1$) or ZnO. Because Al and In of GaN changes the bandgap of GaN, the amount of Al and In of $Al_xIn_yGa_{(1-x-y)}N$ is selected to obtain a bandgap greater than that of the InGaN quantum well 33.

Figure 3:
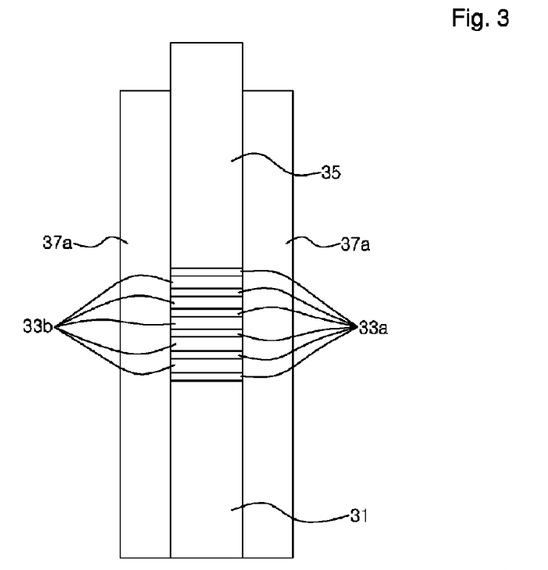
FIG. 3 is a sectional view of a nanostructure according to an embodiment of the present invention.

Although the core nanorod is shown as having a decreasing diameter away from the substrate 10, it is not limited thereto. The diameter of the core nanorod may increase away from the substrate 10. Alternatively, the diameter may be uniform, as shown in FIG. 3.

The nano shell 37a covers at least a side of the quantum well to prevent non-radiative recombination on the surface. As shown, the nano shell 37a may cover an entire outer peripheral surface of the core nanorod excluding a tip portion of the second nanorod.

Meanwhile, an n-type buffer layer 20 may be interposed between the substrate 10 and the nanostructure array. The buffer layer 20 buffers mismatch of lattice constants between the substrate 10 and the first nanorod 31. Further, the buffer layer 20 is electrically connected to the first nanorods 31 to supply electric power thereto. A portion of the buffer layer 20 may extend from the nanostructure array, and an electrode pad 50 is formed on the extension portion of the buffer layer. The electrode pad 50 may be formed of, but not limited to, a Ti/Al layer and a wire (not shown) may be bonded thereto.

When the substrate 10 is a conductive substrate, the buffer layer may be omitted. In this case, the electrode pad 50 may be formed on a surface of the substrate 10 opposite to the array.

Meanwhile, the second nanorods 35 are in ohmic contact with the transparent electrode 60 in common. The transparent electrode 60 is formed of a material that allows light emitted in the longitudinal direction of the nanorods (upward in FIG. 1) to be transmitted therethrough and may be formed of, but not especially limited to, a thin Ni/Au film. An electrode pad 70 as a terminal for supplying electric power through the transparent electrode 60 is formed in a predetermined area on the transparent electrode 60. The electrode pad 70 may be formed of, but not especially limited to, a Ni/Au layer. A wire (not shown) can be bonded to the electrode pad 70.

Empty spaces between adjacent nanostructures may be filled with a transparent insulating material 41, such as spin-on-glass (SOG), $SiO_2$, epoxy or silicone. The transparent insulating material 41 insulates the nanostructures from one another and protects the nanostructures against external shock. Further, the transparent insulating material layer 41 serves as an underlayer that enables the transparent electrode 60 to be connected in common to the respective nanorods. The transparent insulating material layer 41 is formed to have such a height that it reaches slightly below the level of the second nanorods 35 so that tips of the second nanorods 35 can be connected in common to the transparent electrode 60.

The $(Al_xIn_yGa_{1-x-y})N$ (where, $0 \leq x \leq 1$, $0 \leq y \leq 1$ and $0 \leq x+y \leq 1$) quantum well 33 is an active layer that enables visible light with higher luminance to be obtained as compared with a simple p-n junction diode without a quantum well. The quantum well may be a single quantum well of $(Al_xIn_yGa_{1-x-y})N$. As shown in FIG. 3, The quantum well may be a multi quantum well that is formed by alternately stacking a plurality of $(Al_xIn_yGa_{1-x-y})N$ (where, $0 \leq x \leq 1$, $0 \leq y \leq 1$ and $0 \leq x+y \leq 1$) layers 33a and a plurality of $(Al_xIn_yGa_{1-x-y})N$ (where, $0 \leq x \leq 1$, $0 \leq y \leq 1$ and $0 \leq x+y \leq 1$) barrier layers 33b. The nano shell 37a covers at least a side of the multi quantum well, thereby preventing non-radiative recombination on a surface of the multi quantum well.

If electric power is supplied to the nanostructures through the two electrode pads 50 and 70, light with high luminance is emitted in lateral and vertical directions of the core nanorods, as shown in FIG. 1. Since the $(Al_xIn_yGa_{1-x-y})N$ quantum well is particularly formed in each of the nanorods, visible light with higher luminance is emitted as compared to a simple p-n junction diode. Further, a plurality of nano LEDs lead to a remarkable increase in the area of light emitting (light emitting through the sidewall), thereby resulting in much higher light-emission efficiency as compared with a conventional laminated-film type LED. In addition, non-radiative recombination on the surface of the quantum well is prevented due to the nano shell surrounding the $(Al_xIn_yGa_{1-x-y})N$ quantum well, thereby much improving the light-emission efficiency.

Meanwhile, in this embodiment, the wavelength of the light emitted from the LED may be changed by adjusting the amount of In of the $(Al_xIn_yGa_{1-x-y})N$ layers of the multi quantum well or the thickness of the $(Al_xIn_yGa_{1-x-y})N$ layers. It is possible to obtain white light. This will be described below in greater detail with reference to FIG. 3.

The amount of In of the $(Al_xIn_yGa_{1-x-y})N$ layers 33a is first adjusted so that the $(Al_xIn_yGa_{1-x-y})N$ layers have different amounts of In. As the amount of In Increases, the $(Al_xIn_yGa_{1-x-y})N$ has a smaller bandgap, resulting in a longer wavelength of emitted light. Accordingly, the $(Al_xIn_yGa_{1-x-y})N$ layers having different amounts of In emit light with different peak wavelengths. The greater amount of In allows light to be emitted with a longer wavelength. As a result, it is possible to form a $(Al_xIn_yGa_{1-x-y})N$ layer with a desired peak wavelength ranging from an ultraviolet ray region of 370 nm to an infrared ray region by adjusting the amount of In, thereby enabling all visible light including blue, green, and red light to be obtained.

It is possible to fabricate a light emitting diode capable of implementing white light at a chip level by adjusting the amounts of In of the $(Al_xIn_yGa_{1-x-y})N$ layers 33a so that the layers have peak wavelengths in blue and yellow regions, or blue, green and red regions. In addition to the peak wavelengths in these color regions, it is possible to significantly improve a color rendering index of a white light emitting diode by adjusting the amounts of In of the $(Al_xIn_yGa_{1-x-y})N$ layers 33a so that the layers can also have peak wavelengths in other color regions.

Meanwhile, the wavelength of emitted light can be changed by adjusting the thickness of the $(Al_xIn_yGa_{1-x-y})N$ layer 33a. That is, if the thickness of the $(Al_xIn_yGa_{1-x-y})N$ layer is reduced to be less than a Bohr excitation radius, the bandgap of the $(Al_xIn_yGa_{1-x-y})N$ layer increases. Thus, by adjusting the thicknesses of the $(Al_xIn_yGa_{1-x-y})N$ layers 33a, it is possible to form a multi-layer quantum well that emits light with at least two peak wavelengths. Accordingly, multi-color light such as white light can be implemented.

The amounts of In and the thicknesses of the $(Al_xIn_yGa_{1-x-y})N$ layers may be simultaneously adjusted so that $(Al_xIn_yGa_{1-x-y})N$ layers 33a emit light with different peak wavelengths.

Further, multi-color light may also be obtained by using a fluorescent material. In particular, in this embodiment, a white light emitting diode can be simply fabricated by adding a fluorescent material to the transparent insulating material 41 to obtain white light. For example, white light may be emitted by forming the quantum well so that the nanorods 30 emit blue light and by adding a yellow fluorescent material to the transparent insulating material 41.

Although the n-type first nanorod 31 is formed and the p-type second nanorod is formed thereon in the foregoing, the n-type and p-type may be formed in a reverse order.

A method of fabricating the LED of the embodiment will be described below.

First, a method of growing GaN using an epitaxial growth method will be described. The method of growing an epitaxial layer includes a vapor phase epitaxial (VPE) growth method, a liquid phase epitaxial (LPE) growth method, and a solid phase epitaxial (SPE) growth method. In the VPE growth method, a crystal is grown on a substrate through thermal decomposition and reaction of a reaction gas supplied onto the substrate. The VPE growth method can be classified into hydride VPE (HVPE), halide VPE, metalorganic VPE (MOVPE) and the like according to the type of raw material of the reaction gas. While the GaN layer and the InGaN/GaN quantum well are described in this embodiment as being formed using the metalorganic hydride VPE (MO-HVPE) growth, the present invention is not necessarily limited thereto. The GaN layer and the InGaN/GaN quantum well may be formed by using another suitable growth method, e.g., molecular beam epitaxy (MBE) or metalorganic chemical vapor deposition (MOCVD). Further, although the growth of InGaN and GaN is described by way of example, $(Al_xIn_yGa_{1-x-y})N$ may be grown with a desired composition by adjusting precursors.

GaCl, trimethylindium (TMI), trimethylalumiuum (TMA) and $NH_3$ are used as precursors of Ga, In, Al and N, respectively. GaCl may be obtained by reacting metal gallium and HCl with each other at a temperature of 600 to 950° C. Further, impurity elements doped for growth of n-type GaN and p-type GaN are Si and Mg, respectively, and are supplied in the form of $SiH_4$ and Bis(cyclopentadienyl)magnesium ($Cp_2Mg$), respectively.

Now, a method of fabricating the LED according to the embodiment will be described in detail with reference to FIGS. 4 to 7.

Figure 4:
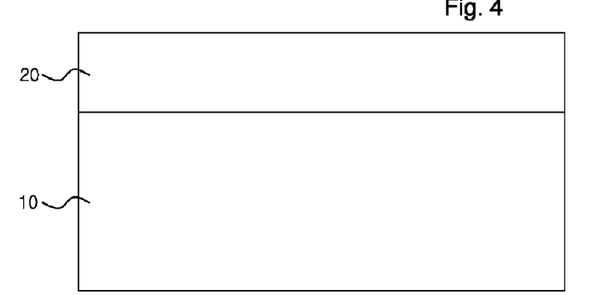
FIGS. 4 to 7 are sectional views illustrating a method of fabricating a light emitting diode according to an embodiment of the present invention.

Referring to FIG. 4, a substrate 10 is placed in a reactor (not shown) and a buffer layer 20 is formed on the substrate. The substrate 10 may be an insulating substrate such as a sapphire or glass substrate, or a conductive substrate such as a Si, $SiO_2$, SiC or ZnO substrate.

The buffer layer 20 may be formed of GaN and may be formed to be an n-type by is doping Si as described above. Otherwise, an n-type GaN buffer layer 20 may be formed to have a thickness of about 1.5 μm without artificial doping by supplying precursors of Ga and N at flow rates of 30 to 70 sccm and 1000 to 2000 sccm for 50 to 60 minutes at a temperature of 400 to 500° C. under the atmospheric pressure or a slight positive pressure, based on the fact that GaN grown without artificial doping has n-type properties due to the presence of nitrogen vacancy, oxygen impurities or the like.

Meanwhile, the buffer layer 20 may be formed to be a p-type by doping Mg, if necessary. Further, when the substrate 10 is conductive, the buffer layer 20 may be omitted.

Figure 5:
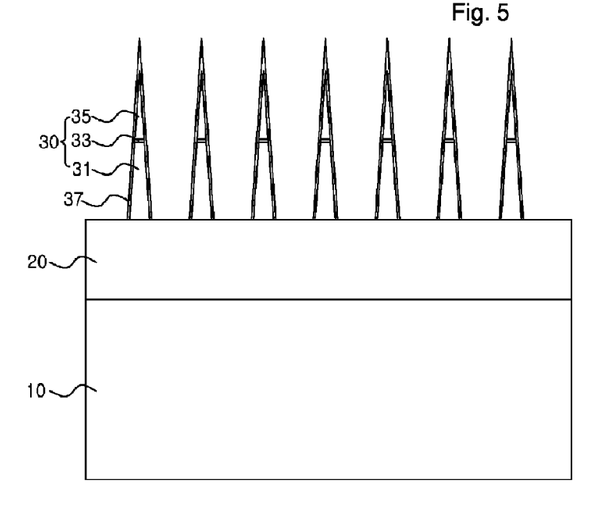

Referring to FIG. 5, an array of a plurality of core nanorods 30 is formed on the buffer layer 20. The array of the core nanorods 30 may be formed in-situ in the reactor in which the n-type GaN buffer layer 20 has been grown.

First, n-type GaN nanorods 31 are first grown. That is, the n-type GaN nanorods 31 can be formed to have a height of about 0.5 μm perpendicularly to the n-type GaN buffer layer 20 by supplying precursors of Ga and N to the reactor at respective flow rates of 30 to 70 sccm and 1000 to 2000 seem and simultaneously supplying $SiH_4$ at a flow rate of 5 to 20 sccm for 20 to 40 minutes at a temperature of 400 to 600° C. under the atmospheric pressure or a slight positive pressure.

Meanwhile, if GaN is grown at a high temperature (e.g., 1000° C. or more), an initial GaN seed is rapidly grown upwardly and laterally in the form of a thin film rather than a nanorod. In this case, dislocations inevitably occur at the boundaries where seeds meet one another due to lateral growth thereof and the dislocations propagate in a thickness direction when the thin film is grown in the thickness direction, resulting in threading dislocations. However, by maintaining the process conditions as in the above embodiment, the seeds are grown primarily upwardly without the use of an additional catalyst or template, resulting in the growth of a plurality of n-type GaN nanorods 31 with a substantially uniform height and diameter.

InGaN quantum wells 33 are then grown on the n-type GaN nanorods 31. Specifically, precursors of Ga, In and N are supplied into the reactor at respective flow rates of 30 to 70 sccm, 10 to 40 sccm and 1000 to 2000 sccm at a temperature of 400 to 500° C. under the atmospheric pressure or a slight positive pressure. Thus, the InGaN quantum wells 33 are formed on the n-type GaN nanorods 31. At this time, growth time of the InGaN quantum wells 33 is properly selected until the InGaN quantum wells 33 are grown to have a desired thickness. Because the thickness of the quantum wells 33 is a factor determining the wavelength of light emitted from a completed LED as described above, the growth time is determined according to the thickness of the quantum wells 33 set for light with a desired wavelength. Further, because the wavelength of the emitted light varies with the amount of In, the ratio of supplied precursors is adjusted according to a desired wavelength so as to adjust the amount of 1n.

The InGaN quantum wells 33 are formed to have a multi quantum well structure obtained by alternately stacking a plurality of InGaN layers 33a and a plurality of GaN barrier layers 33b, as shown in FIG. 3. This can be obtained by repeatedly interrupting the supply of the precursor of 1n.

Subsequently, p-type GaN nanorods 35 are grown on the InGaN quantum wells 33. Specifically, the p-type GaN nanorods 35 may be formed to have a height of about 0.4 μm perpendicularly to the substrate 10 by supplying precursors of Ga and N into the reactor at respective flow rates of 30 to 70 seem and 1000 to 2000 sccm and simultaneously supplying $Cp_2Mg$ at a flow rate of 5 to 20 seem for 20 to 40 minutes at a temperature of 400 to 600° C. under the atmospheric pressure or a slight positive pressure.

Then, first nano shells 37 are formed to cover the core nanorods 30. The first nano shells 37 may also be formed in-situ in the same reactor. Specifically, after the p type GaN nanorods 35 are formed, a remaining gas in the reactor is drained and the precursors of Ga and N precursors are then supplied to the reactor at flow rates of 10 to 200 seem and 100 to 2000 seem, respectively. The temperature of the reactor may be 400 to 800° C. TMI and/or an Al precursor such as TMA may be supplied together. Accordingly, first nano shells 37 of $(Al_xIn_yGa_{1-x-y})N$ (where, $0 \leq x \leq 1$, $0 \leq y \leq 1$ and $0 \leq x+y \leq 1$) can be formed to cover the core nanorods 30.

Alternatively, the nano shells may be formed in another reactor different from the reactor, and the first nano shells 37 may be formed of ZnO doped with Mg.

Figure 6:
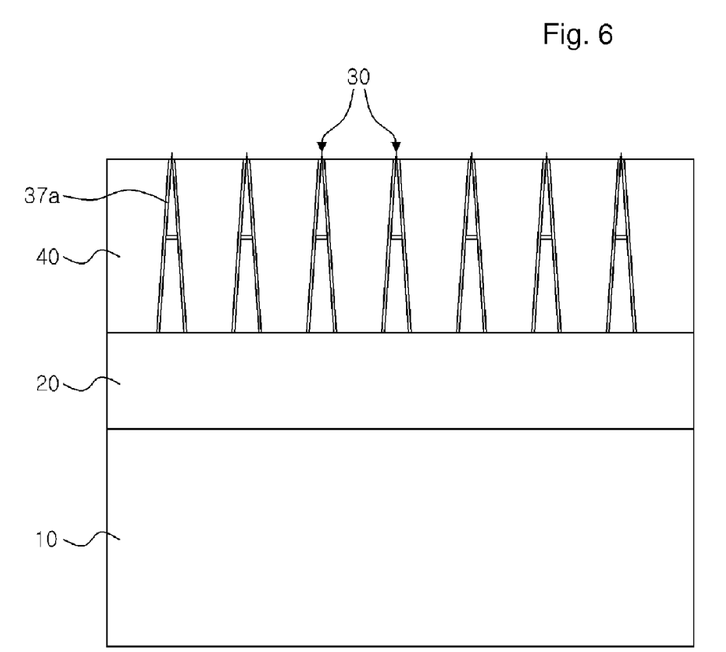

Referring to FIG. 6, after the first nano shells are formed, empty spaces between the core nanorods 30 are filled with a transparent insulating material 40. The transparent insulating material 40 is formed to be below the level of the second nanorods 35 so that tips of the second nanorods 35 and first nano shells 37 can protrude outwardly. To this end, the transparent insulating material 40 may be recessed through a selective etching process after the coating of the transparent insulating material 40 is performed.

The transparent insulating material 40 may be a material that transmits light emitted from the core nanorods 30 therethrough and has a superior gap-fill property. For example, the transparent insulating material 40 may be SOG, $SiO_2$, epoxy or silicone. In case of SOG, it may be subjected to spin coating and curing processes.

Subsequently, the tips of the first nano shells 37 are selectively etched to expose the tips of the second nanorods 35. As a result, nano shells 37a covering the core nanorods 30 excluding the tips of the second nanorods 35 are formed, thereby completing nanostructures.

The selective etching process may be either dry etching or wet etching. However, the dry etching is desirable when the first nano shell 37 and the second nanorod 35 are formed of the same material.

Figure 7:
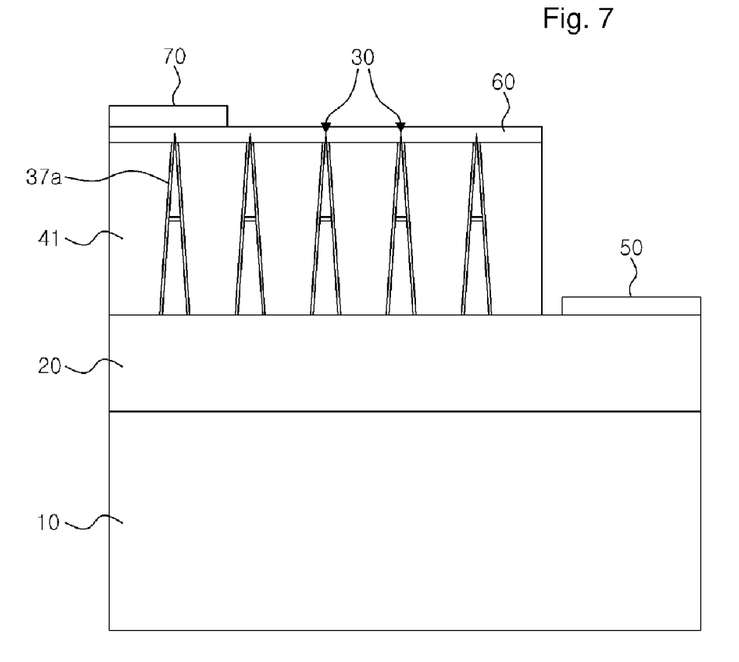

Referring to FIG. 7, a transparent electrode 60 is formed on the entire surface of the substrate with the second nanorods 35 exposed. The transparent electrode 60 comes in ohmic contact with the second nanorods 35, which slightly protrude beyond the transparent insulating material 40. Preferably, the transparent electrode 60 has a small thickness enough to allow light emitted from the core nanorods 30 to be transmitted therethrough.

Subsequently, the transparent electrode 60 and the transparent insulating material 40 are partially removed using photolithography and etching processes to expose a portion of the buffer layer 20. At this time, nanostructures formed on the portion are removed together. Accordingly, the transparent insulating material 41 remains to define a light-emitting region, i.e., a region where the array of the nanostructures is located, and the buffer layer 20 protrudes and is exposed outwardly from the light-emitting region.

An electrode pad 50 is formed on the exposed portion of the buffer layer 20 by means of a lift-off process. The electrode pad may be formed of a Ti/Al layer through electron-beam evaporation. Similarly, an electrode pad 70 is formed of, for example, a Ni/Au layer on the transparent electrode 60.

While the transparent electrode 60 has been formed before the portion of the buffer layer is exposed, it may be formed after the buffer layer 20 has been exposed.

According to this embodiment, it is possible to uniformly grow core nanorods each of which comprises an n-type GaN nanorod 31, an InGaN quantum well 33 and a p-type GaN nanorod in sequence without the use of a catalyst or template.

Further, in the method of fabricating the nanorod according to this embodiment, the processes can be carried out at a low temperature, thereby allowing the use of a glass substrate and reducing production costs of a light emitting diode. Further, as described above, the process of forming the n-type GaN buffer layer 20 may be omitted by using a SiC, ZnO or silicon substrate, and the electrode pad 50 may be formed on a bottom surface of the substrate rather than on the portion of the GaN buffer layer 20. That is, the electrode pad may be first formed on a side of the substrate and the core nanorods 30 may be formed directly on an opposite side of the substrate.

INDUSTRIAL APPLICABILITY

According to the embodiments of the present invention, it is possible to provide a nanostructure capable of more increased light-emission efficiency by reducing the influence of non-radiative recombination on a surface of the nanostructure, and to provide a light emitting diode with high luminance and high light-emission efficiency by employing an array of the nanostructures. It is also possible to provide a method of fabricating a light emitting diode that employs an array of nanostructures capable of reducing the influence of non-radiative recombination on surfaces of the nanostructures.

The invention claimed is:

1. A light emitting diode, comprising:
   a substrate;
   an array of nanostructures, each of the nanostructures includes a core nanorod formed substantially perpendicularly to the substrate and having a first nanorod of a first conductivity type, a $(Al_xIn_yGa_{1-x-y})N$ (where, $0 \leq x \leq 1$, $0 \leq y \leq 1$ and $0 \leq x+y \leq 1$) quantum well, and a second nanorod of a second conductivity type, all of them being joined in a longitudinal direction, and a nano shell formed of a material with a bandgap greater than that of the $(Al_xIn_yGa_{1-x-y})N$ quantum well to surround at least the $(Al_xIn_yGa_{1-x-y})N$ quantum well of the core nanorod and configured to reduce non-radiative recombination; and
   a transparent electrode connected in common to the second nanorods,
   wherein the nano shell covers at least a portion of the sidewall of the first nanorod, the quantum well, and at least a portion of the sidewall of the second nanorod, and
   wherein the nano shell does not cover a tip of the second nanorod and a region between the nanostructures.

2. The light emitting diode as claimed in claim 1, wherein the first nanorod and the second nanorod are formed of either $(Al_xIn_yGa_{1-x-y})N$ (where, $0 \leq x \leq 1$, $0 \leq y \leq 1$ and $0 \leq x+y \leq 1$) or ZnO.

3. The light emitting diode as claimed in claim 1, wherein the material with the bandgap greater than that of the quantum well is either $(Al_xIn_yGa_{1-x-y})N$ (where, $0 \leq x \leq 1$, $0 \leq y \leq 1$ and $0 \leq x+y \leq 1$) or ZnO, and the amounts of Al and In in $(Al_xIn_yGa_{1-x-y})N$ is selected to obtain the band gap greater than that of the $(Al_xIn_yGa_{1-x-y})N$ quantum well.

4. The light emitting diode as claimed in claim 1, further comprising a transparent insulating material with which empty spaces between the nanostructures are filled, wherein tips of the second nanorods protrude beyond a top surface of the transparent insulating material and are connected to the transparent electrode.

5. The light emitting diode as claimed in claim 4, wherein the transparent insulating material is SOG, $SiO_2$, epoxy or silicone.

6. The light emitting diode as claimed in claim 4, wherein the transparent insulating material contains a fluorescent material for converting the wavelength of a portion of light emitted from the core nanorod.

7. The light emitting diode as claimed in claim 1, wherein the $(Al_xIn_yGa_{1-x-y})N$ quantum well is a multi quantum well formed by alternately stacking a plurality of $(Al_xIn_yGa_{1-x-y})N$ (where, $0 \leq x < 1$, $0 \leq y \leq 1$ and $0 \leq x+y \leq 1$) layers and a plurality of $(Al_xIn_yGa_{1-x-y})N$ (where, $0 \leq x \leq x \leq 1$, $0 \leq y < 1$ and $0 \leq x+y \leq 1$) barriers.

8. The light emitting diode as claimed in claim 7, wherein at least two of the plurality of $(Al_xIn_yGa_{1-x-y})N$ layers have different amounts of In or different thicknesses to emit light with at least two peak wavelengths.

9. The light emitting diode as claimed in claim 1, further comprising a GaN buffer layer of a first conductivity type interposed between the substrate and the array of the nanostructures.

10. The light emitting diode as claimed in claim 9, wherein the buffer layer has a portion extending from the array of the nanostructures, and an electrode pad is formed on the extension portion of the buffer layer.

11. A method of fabricating a light emitting diode, comprising the steps of:
forming an array of core nanorods perpendicularly to a substrate, each of the core nanorods having a first nanorod of a first conductivity type, an $(Al_xIn_yGa_{1-x-y})N$ (where, $0 \leq x<1$, $0 \leq y \leq 1$ and $0 \leq x+y \leq 1$) quantum well and a second nanorod of a second conductivity type, all of them being joined in a longitudinal direction;
forming first nano shells out of a material with a bandgap greater than that of the $(Al_xIn_yGa_{1-x-y})N$ quantum well so as to cover the core nanorods, wherein each first nano shell covers at least a portion of the sidewall of the first nanorod, the quantum well, and at least a portion of the sidewall of the second nanorod and is configured to reduce non-radiative recombination;
forming nano shells by etching tips of the first nano shells to expose tips of the second nanorods; and
forming a transparent electrode connected in common to the exposed tips of the second nanorods,
wherein the nano shell does not cover a tip of the second nanorod and a region between the core nanorods.

12. The method as claimed in claim 11, further comprising the step of forming a transparent insulating material with which empty spaces between the core nanorods are filled after the step of forming the first nano shells, wherein the transparent insulating material is formed to be below the level of the second nanorods so that the tips of the second nanorods and nano shells protrude outwardly.

13. The method as claimed in claim 12, further comprising the steps of:
forming a GaN buffer layer of a first conductivity type on the substrate before the step of forming the array of core nanorods; and
patterning the transparent insulating material using photolithography and etching processes to expose a portion of the buffer layer.

14. The method as claimed in claim 13, further comprising the step of forming electrode pads on the transparent electrode and the exposed portion of the buffer layer, respectively.

15. The method as claimed in claim 11, wherein the $(Al_xIn_yGa_{1-x-y})N$ quantum well is a multi quantum well formed by alternately stacking a plurality of $(Al_xIn_yGa_{1-x-y})N$ (where, $0 \leq x<1$, $0 \leq y \leq 1$ and $0 \leq x+y \leq 1$) layers and a plurality of $(Al_xIn_yGa_{1-x-y})N$ (where, $0 \leq x \leq 1$, $0 \leq y<1$ and $0 \leq x+y \leq 1$) barriers.

16. The method as claimed in claim 15, wherein the first nanorod, the multi quantum well and the second nanorod are formed in-situ using MO-HVPE, MBE or MOCVD.

17. The method as claimed in claim 11, wherein the nano shells are formed at a temperature of 400° C. to 800° C.

* * * * *